United States Patent
Beroz et al.

(10) Patent No.: US 6,541,845 B2
(45) Date of Patent: *Apr. 1, 2003

(54) COMPONENTS WITH RELEASABLE LEADS AND METHODS OF MAKING RELEASABLE LEADS

(75) Inventors: Masud Beroz, Livermore, CA (US); Thomas H. DiStefano, Monte Sereno, CA (US); Anthony B. Faraci, Georgetown, TX (US); Joseph Fjelstad, Sunnyvale, CA (US); Belgacem Haba, Cupertino, CA (US)

(73) Assignee: Tessera, Inc., San Jose, CA (US)

( * ) Notice: Subject to any disclaimer, the term of this patent is extended or adjusted under 35 U.S.C. 154(b) by 97 days.

This patent is subject to a terminal disclaimer.

(21) Appl. No.: 09/777,781

(22) Filed: Feb. 6, 2001

(65) Prior Publication Data

US 2001/0006253 A1 Jul. 5, 2001

Related U.S. Application Data

(62) Division of application No. 09/471,973, filed on Dec. 23, 1999, now Pat. No. 6,261,863, which is a continuation-in-part of application No. 09/290,975, filed on Apr. 13, 1999, now abandoned, which is a continuation of application No. 09/008,283, filed on Jan. 16, 1998, now Pat. No. 5,904,498, which is a division of application No. 08/547,170, filed on Oct. 24, 1995, now Pat. No. 5,763,941.

(51) Int. Cl.⁷ .................... H01L 21/44; H01L 21/48; H01L 21/50

(52) U.S. Cl. .................. 257/669; 257/692; 257/734; 257/774; 257/668; 438/106

(58) Field of Search ................. 438/106, 108, 438/121; 257/669, 668, 692, 734, 774, 642; 174/267

(56) References Cited

U.S. PATENT DOCUMENTS

| | | | |
|---|---|---|---|
| 3,825,353 A | 7/1974 | Loro | 317/234 R |
| 4,451,505 A | 5/1984 | Jans | 427/98 |
| 4,651,191 A | 3/1987 | Ooue et al. | 357/71 |
| 4,893,172 A | 1/1990 | Matsumoto et al. | 357/79 |
| 5,065,223 A | 11/1991 | Matsuki et al. | 357/68 |
| 5,086,337 A | 2/1992 | Noro et al. | 357/79 |
| 5,196,268 A | 3/1993 | Fritz | 428/458 |
| 5,376,326 A | 12/1994 | Medney et al. | 264/510 |
| 5,518,964 A | 5/1996 | DiStefano et al. | 437/209 |
| 5,548,091 A | 8/1996 | DiStefano et al. | 174/260 |
| 5,763,941 A | * 6/1998 | Fjelstad | |
| 5,904,498 A | 5/1999 | Fjelstad | 438/106 |
| 6,307,260 B1 | * 10/2001 | Smith et al. | 257/692 |
| 6,361,959 B1 | * 3/2002 | Beroz et al. | 435/14 |

FOREIGN PATENT DOCUMENTS

| | | |
|---|---|---|
| WO | WO 94/03036 | 2/1994 |
| WO | WO 97/11588 | 3/1997 |

\* cited by examiner

Primary Examiner—John F. Niebling
Assistant Examiner—Lynn A. Gurley
(74) Attorney, Agent, or Firm—Lerner, David, Littenberg, Krumholz & Mentlik, LLP

(57) ABSTRACT

A connection component for a microelectronic device such as a semiconductor chip incorporates a support layer and conductive structures extending across a surface of the support layer. The conductive structures have anchors connecting them to the support layer, and releasable or unanchored portions.

12 Claims, 6 Drawing Sheets

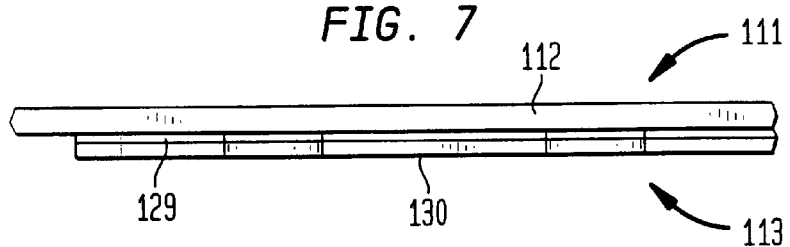
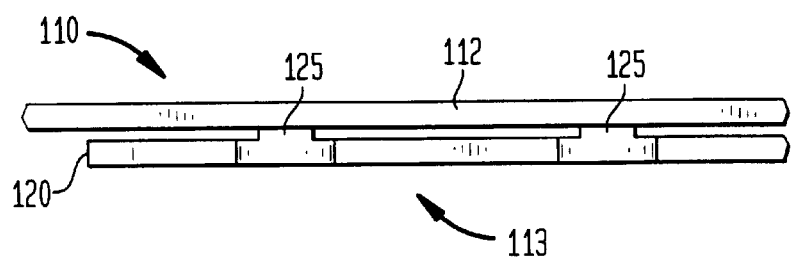
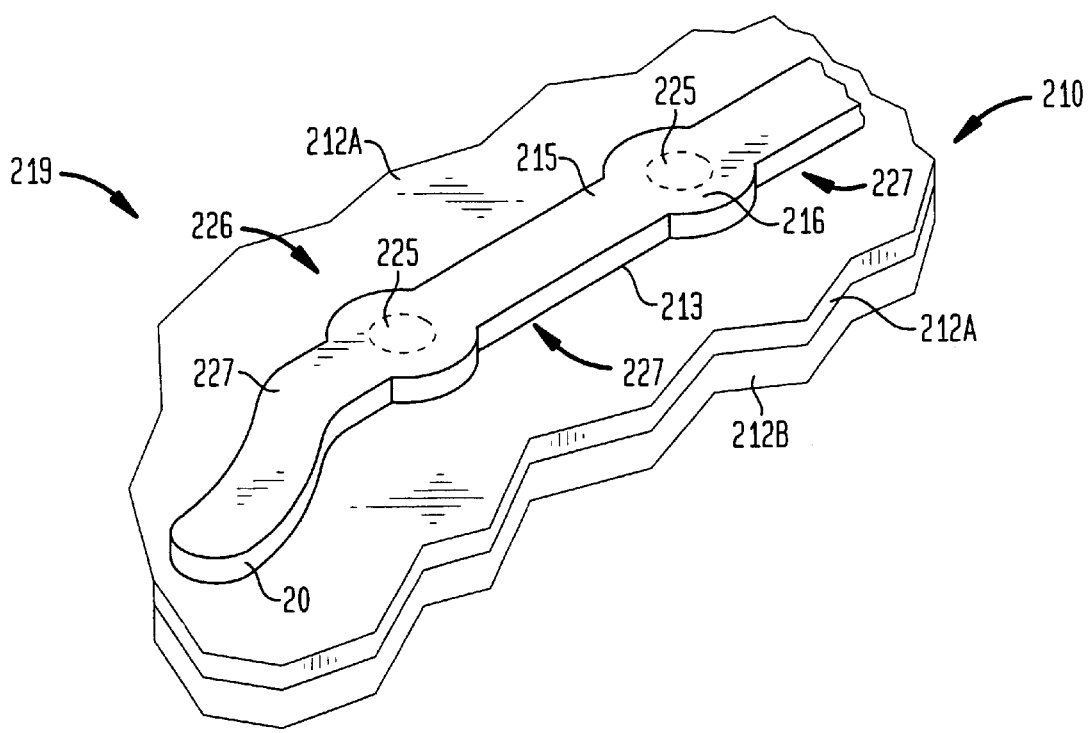

COMPONENTS WITH RELEASABLE LEADS AND METHODS OF MAKING RELEASABLE LEADS

CROSS REFERENCE TO RELATED APPLICATIONS

The present application is a divisional of U.S. patent application Ser. No. 09/471,973, filed Dec. 23, 1999, now U.S. Pat. No. 6,261,863, which is a continuation-in-part of U.S. patent application Ser. No. 09/290,975, filed Apr. 13, 1999, now abandoned which in turn is a continuation of U.S. patent application Ser. No. 09/008,283, filed Jan. 16, 1998 (now U.S. Pat. No. 5,904,498), which in turn is a Divisional of U.S. patent application Ser. No. 08/547,170, filed Oct. 24, 1995 (now U.S. Pat. No. 5,763,941), the disclosures of which are all hereby incorporated by reference herein.

FIELD OF THE INVENTION

The present invention relates to a component useful in making electrical connections to microelectronic elements such as semiconductor chips, and to methods of manufacturing such components.

BACKGROUND OF THE INVENTION

Certain techniques for making semiconductor chip assemblies and similar microelectronic assemblies employ releasably attached leads. One such process is disclosed in commonly assigned, U.S. Pat. No. 5,518,964, the disclosure of which is hereby incorporated by reference herein. In certain preferred embodiments described in U.S. Pat. No. 5,518,964, a first element such as a dielectric layer in a connection component is provided with a plurality of elongated, flexible leads extending along a surface of the element. Each lead has a terminal end permanently attached to the first element and has a tip end offset from the terminal end. The tip ends of the leads may be releasably secured to the first element. A second element such as a semiconductor chip having contacts thereon is engaged with the first element or connection component, and the tip ends of the leads are bonded to contacts on the chip or second element. The elements are then moved away from one another so as to deform the leads and provide vertically extensive leads extending between the first and second elements, i.e., between the chip and the connection component. A compliant material may be introduced between the chip and the connection component.

The resulting structure allows the chip to move relative to the connection component without substantial stresses on the leads, and thus provides compensation for thermal expansion. The preferred structures can be readily tested and can be mounted on a further substrate such as a printed circuit panel or the like. Preferred embodiments of the processes disclosed in U.S. Pat. No. 5,518,964 can be used with chips or the microelectronic element having large numbers of terminals. In the preferred processes, many leads can be deformed simultaneously. In particularly preferred processes according to U.S. Pat. No. 5,518,964, the leads on a given connection component or first element may be connected to contacts on a plurality of chips such as an array of several chips or numerous chips formed as part of a wafer, so that many leads are deformed simultaneously.

In certain embodiments disclosed in U.S. Pat. No. 5,518,964, the tip end of each lead is bonded to the surface of the first element by a small spot of a base metal such as copper interposed between the tip end and the surface. Typically, such a spot is formed by a process in which the leads are formed from an etch-resistant metal such as gold overlying a continuous layer of the base metal. The leads have wide portions at the tip and terminal ends. The component is then subjected to an etching process so as to undercut the lead and remove the base metal from beneath the etch-resistant metal at all locations except at the terminal end and at the tip end. At the tip end, most, but not all of the base metal is removed from beneath the etch-resistant metal, leaving a very small spot of the base metal. The strength of the bond between the tip and the connection component surface is effectively controlled by the size of the spot. Thus, although the base metal may provide a relatively high bond strength per unit area or per unit length, it may still provide a weak attachment. Although structures such as frangible lead sections and small buttons can provide useful releasable attachments for the tip ends of the leads, some care is required in fabrication to form these features. For example, formation of spots of uniform size beneath the terminal ends of leads on a large connection component requires careful control of the etching process.

As described in PCT International Publication WO 94/03036, the disclosure of which is hereby also incorporated herein by reference, a connection component may incorporate a support structure such as a polyimide or other dielectric layer with one or more gaps extending through such layer. Preferably, the support structure incorporates one or more flexible or compliant layers. The connection component may further include leads extending across the gap. Each lead has a first or terminal end permanently secured to the support structure on one side of the gap, and a second end releasably attached to the support structure on the opposite side of the gap. In preferred processes as taught by '036 publication, the connection component is positioned on a semiconductor chip or other microelectronic element. Each lead is engaged by a bonding tool and forced downwardly into the gap, thereby detaching the releasably connected second end from the support structure. The leads are flexed downwardly into the gap and bonded to the contacts on the chip or the microelectronic element. Preferred connection components and processes according to the '036 publication also provide highly efficient bonding processes and very compact assemblies. The finished products provide numerous advantages such as compensation for thermal expansion, ease of testing and a compact configuration.

Other structures disclosed in the '036 publication and in U.S. Pat. No. 5,518,964 employ frangible lead sections connecting the releasable end of each lead to another structure permanently mounted to the support structure or first element. Frangible sections can also provide useful results. However, such frangible elements are most commonly formed by using the photo-etching or selective deposition processes used to form the lead itself to form a narrow section. The minimum width at the narrow section, can be no less than the smallest width formable in the process. As the other portions of the lead adjacent the narrow section must be wider than the narrow section, these other portions must be larger than the minimum attainable in the process. Stated another way, the leads made by such a process generally are wider than the minimum line width attainable in the formation process. This limits the number of leads which can be accommodated in a given area.

In other embodiments disclosed in the '036 publication, the first or permanently mounted terminal end of a lead may have a relatively large area, whereas the second or releasably mounted end of the lead overlying the support structure may have a relatively small area, so that such second end will break away from the support structure before the first end when the lead is forced downwardly by the bonding tool. This arrangement requires careful control of the dimensions of the ends to control the area of the bond between the lead end and the support structure and also requires a lead wider than the smallest element formable in the process.

As described in the '036 publication, and as further described in commonly assigned International Publication WO 97/11588, the disclosure of which is also incorporated by reference herein, leads used in these and other microelectronic connection components may include polymeric layers in addition to metallic layers. The polymeric layers structurally reinforce the leads. For example, certain leads described in the '588 publication incorporate a pair of thin conductive layers such as metallic layers overlying opposite surfaces of a polymeric layer. One conductive layer may be used as a signal conductor, whereas the opposite conductive layer may act as a potential reference conductor. The composite lead thus provides a stripline extending along the lead. A stripline lead of this nature can provide a low, well-controlled impedance along the lead, which enhances the speed of operation of the circuit formed by the connection component and the associated microelectronic elements. The potential reference conductor also helps to reduce crosstalk or undesirable inductive signal coupling between adjacent leads.

In certain embodiments disclosed by commonly assigned U.S. patent application Ser. No. 09/020,750, filed Feb. 9, 1998, the disclosure of which is hereby incorporated by reference herein, a starting structure has one or more metallic leads overlying a polymeric dielectric layer. The dielectric layer is exposed to an etchant for etching the dielectric layer. The etchant attacks the dielectric layer so that the leads are releasably attached to the dielectric layer by connection regions of the dielectric layer which remain after the etching step.

Another method of making connection components with releasable leads is disclosed in certain embodiments of U.S. patent application Ser. No. 09/200,100, filed Nov. 25, 1998, the disclosure of which is hereby incorporated by reference herein.

Accordingly, further improvements in releasable lead structures and methods of making the same are desired.

SUMMARY OF THE INVENTION

A method in accordance with one aspect of the present invention comprises a method of making a connection component comprising the steps of providing a starting structure including one or more metallic conductive structures overlying a surface of a support layer. The area of contact between the surface of the support layer and the conductive structures is reduced by removing material from the one or more conductive structures or the support layer or both so as to leave a plurality of etch-defined anchors connecting the one or more conductive structures to the support layer and at least some portions of the conductive structures unattached or releasably attached to the support layer. The plurality of anchors are spaced from one another on the one or more conductive structures. According to this aspect of the present invention, the anchors attach the conductive structures to the support structure and support the conductive structures thereon. The anchors are spaced along the conductive structures and may comprise segments of the support layer or the conductive structures. The conductive structures have sections sufficiently wide to form the anchors for supporting the conductive structures on the support structure.

Connection components typically include terminals which may be spaced on the surface area of the connection component. In forming conductive structures on a component, conductive structures span a distance along a surface of the connection component to form connections with the terminals. In some cases, routing the conductive structures on the component requires conductive structures which are relatively longer than others. Releasable conductive structures may be long enough to become vulnerable to unwanted detachment from the connection component. It is desirable that the conductive structures include some sections being wide enough to form a secure connection with the component and some sections being narrow enough to closely space the conductive structures on the component.

Thus, the conductive structures most preferably include wider sections and narrow elongated sections extending between the wider sections. The removing material step is performed so that the anchors extend from the wider sections to the support layer. The narrow elongated sections enable the conductive structures to be closely spaced on the connection component while the conductive structures are supported at the wider sections. The one or more conductive structures preferably comprise a plurality of conductive structures.

A method in accordance with the invention preferably includes a step of removing material by etching the conductive structures by exposing the conductive structures to an etchant. The support layer, in certain preferred embodiments, includes a layer of dielectric material. The support layer preferably comprises a material relatively unaffected by the step of etching the conductive structures. In other preferred embodiments, the support layer comprises a layer of a metallic material having different etching properties from the conductive structures.

In certain preferred embodiments, the support layer comprises a layer of dielectric material and the step of removing material comprises etching the support layer by exposing the support layer to an etchant.

In other preferred embodiments, the support layer includes a layer of metallic material having different etching properties from the metallic material of the conductive structures and the step of removing material comprises etching the layer of metallic material by exposing the layer of metallic material to an etchant.

The step of reducing the area of contact between the support layer and the conductive structures may be performed so as to leave at least one elongated lead portion of the conductive structures. The step of reducing the area of contact may be performed so as to leave at least one portion of the conductive structures unattached to the support layer. However, the step of reducing the area of contact may also be performed so as to leave at least one portion of the conductive structures releasably attached to the support layer. Thus, the conductive structures. The step of reducing the area of contact may include portions which are unattached to the support layer and/or portions which are releasably attached to the support layer.

The conductive structures may include a base layer and a cover layer overlying the base layer. The step of etching the conductive structures may be performed so as to remove metal from the base layer, undercutting the conductive structures, tending to reduce the area of contact between the support layer and the conductive structures. The conductive structures may include an etching mask covering a portion of the conductive structures during the step of etching the conductive structures. The cover layer may comprise a metal different from the base layer of the conductive structures so that the cover layer remains substantially unaffected by the step of etching.

The conductive structures preferably have sections of different widths, as discussed briefly above. In certain preferred embodiments, the conductive structures include a plurality of wider sections having a first width and at least one narrower section having a second width smaller than the first width. During the step of removing material, the anchors are formed at the wider sections and the at least one portion unattached or releasably attached is formed at the at least one narrower section. The at least one narrower section may comprise an elongated portion of the conductive structures. The at least one narrower section may also include a section extending across a gap in the support layer which is movable with respect to the support layer. In this aspect of the invention, the conductive structures may comprise leads which may be forced downwardly through the gap to be bonded to a microchip or other microelectronic element, such as a wafer disposed beneath the connection component. A segment of the lead which is releasably attached to the support layer is detached from the support layer during the forcing of the lead downwardly through the gap, as discussed in certain embodiments of PCT International Publication No. WO 94/03036, the disclosure of which is hereby incorporated by reference herein.

The conductive structures may overlie a first surface of the support layer so that the step of reducing the area of contact includes the step of exposing the first surface to an etchant. The step of etching the support layer may comprise utilizing a gaseous etchant, which may include one or more oxidizing species, or a plasma of a reaction gas including one or more oxidizing gases with or without one or more carrier gases. Material may be removed from the support layer or the conductive structures or both utilizing a chemical etchant such as HCl or CuCl.

The method of making a connection component in another aspect of the invention comprises providing a starting structure including one or more metallic conductive structures overlying a surface of the support layer and removing material from the one or more conductive structures, the support layer or both so as to leave at least one elongated etch-defined anchors connecting the one or more conductive structures to the support layer and at least some portions of the conductive structures releasably attached to the support layer. Methods in accordance with this aspect of the invention may otherwise be performed as discussed above. Each of the conductive structures preferably has a wider section having a first width and a narrower section having a second width smaller than the first width so that during the step of removing material, an anchor is formed from the wider section. An unattached or releasably attached portion is formed from the narrower section.

In another aspect of the present invention, a microelectronic connection component comprises a support structure including a support layer having a surface and one or more metallic conductive structures overlying the surface of the support layer, and a plurality of anchors spaced from one another and attaching the conductive structures to the support layer at an anchored portion. The plurality of anchors have an area of contact with the one or more conductive structures which is less than the area of the conductive structures at the anchored portion. In certain preferred embodiments, the anchors are integral with the conductive structures. In other preferred embodiments, the anchors are integral with the support layer. The conductive structures, in certain preferred embodiments, include releasable connections between the conductive structures and the support layer. In other preferred embodiments, the conductive structures include portions unattached to the support layer.

The conductive structures preferably include elongated portions and anchors at anchored portions of the conductive structures, the anchors having a width larger than releasable portions of the conductive structures. The conductive structures, in certain preferred embodiments, preferably include releasable portions extending across a gap in the support layer, as discussed above. The elongated releasable portions may be curved. The curvature of the releasable segments provides additional length for spanning between the connection component and a microchip or other microelectronic elements, such as wafers.

The conductive structures may include portions vertically spaced from the support layer. The conductive structures, in preferred embodiments, are spaced on the component so that wider portions of a first conductive structure are adjacent narrower portions of a second conductive structure.

In other preferred embodiments, the microelectronic connection component comprises a support structure including a support layer having a surface and one or more metallic conductive structures overlying the surface of the support layer, the conductive structures being vertically spaced from the surface by at least one elongated anchor attaching the conductive structures to the support layer. The anchors may be integral with the conductive structures of the support layer. In certain preferred embodiments, the conductive structures include releasable connections between the conductive structures and the support layer. In other preferred embodiments, the conductive structures include portions unattached to the support layer.

The conductive structures, in preferred embodiments, include sections with a first width and narrower sections having a second width smaller than the first width, the wider sections being attached to the support layer by the at least one anchor. The conductive structures may include elongated narrower sections extending across a gap in the support layer, in certain preferred embodiments. The elongated narrower sections may be curved.

These and other objects, features and advantages of the present invention will be more readily apparent from the detailed description of the preferred embodiment, taken in conjunction with the accompanying drawings.

BRIEF DESCRIPTION OF THE DRAWINGS

FIG. 7 is a cross-sectional view similar to FIG. 2, in a method in accordance with a further embodiment of the invention;

FIG. 8 is the cross-sectional view of FIG. 7 at a later time in the method;

FIG. 9 is a top right perspective view of a connection component made in a method in accordance with a further embodiment of the invention;

DETAILED DESCRIPTION OF THE PREFERRED EMBODIMENTS

Figure 1:
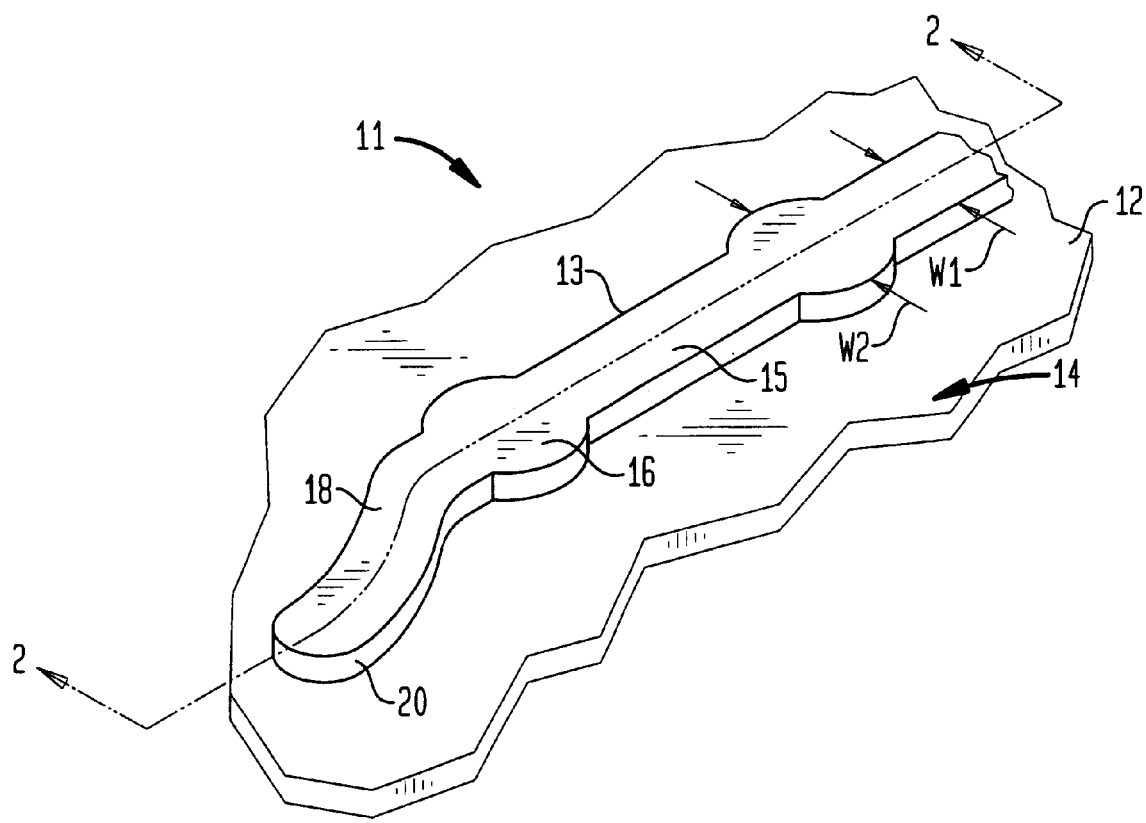
FIG. 1 is a partial top right perspective view of a starting structure for a method in accordance with one embodiment of the invention.
Figure 2:
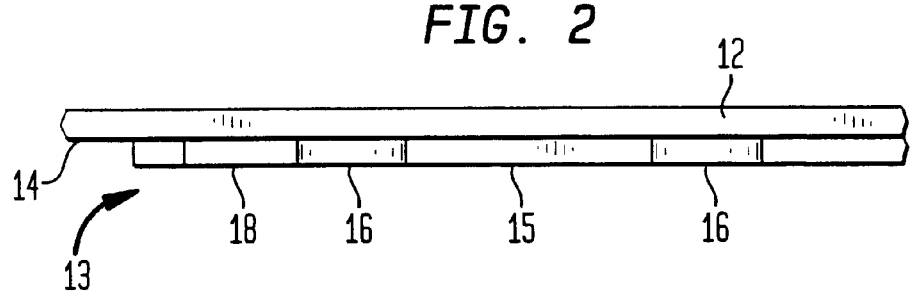
FIG. 2 is a cross-sectional view taken along line 2—2 in FIG. 1.

A process in accordance with one embodiment of the invention includes providing a starting structure 11, including a support layer 12 comprising a layer of dielectric material commonly used in electronic components, such as polyimide having a number of conductive structures such as traces 13 extending along a first surface 14 of the support layer 12. The traces 13 have a number of elongated sections 15 and a number of wider sections or buttons 16 distributed along the length of the traces 13 so that the elongated sections 15 extend between the buttons 16. The elongated sections 15 have a width W1 which is smaller than the width W2 of the buttons 16, as shown in FIG. 1. The traces 13 have a narrow lead section 18 at an end 20 of each trace 13. Narrow lead section 18 also has a width less than the width W2. In certain preferred embodiments, the narrow section 18 curves in a direction transverse to the length of the traces 13.

The starting structure 11 may be formed in a number of conventional processes. Traces 13, for example, may be formed by depositing electrically conductive metal onto the support layer 12 in the pattern of the traces 13 by plating metal in a pattern defined by a photographically patterned mask. A metal layer may be laminated onto the support layer 12 and the metal layer may be etched in a pattern defined by a patterned mask. A number of other conventional processes may also be utilized. Processes for forming traces which provide strong adhesion between the traces and the support layer are preferred. The traces 13 may be formed from virtually any electrically conductive metal and may include layers of different metals. The starting structure may comprise a structure including a number of dielectric layers having layers of internal conductive elements. The starting structure may be fabricated as disclosed in commonly assigned U.S. patent application Ser. No. 09/020,750, filed Feb. 9, 1998, the disclosure of which is hereby incorporated by reference herein.

Figure 3:
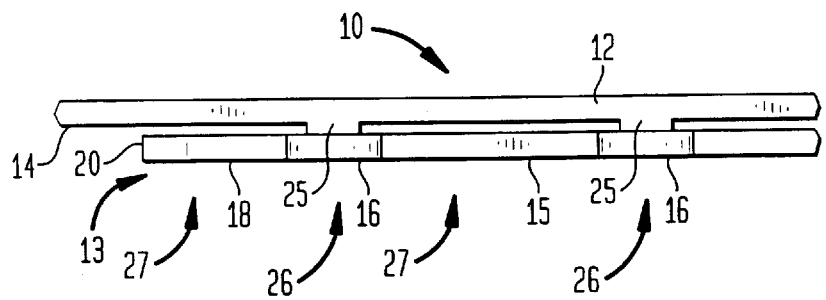
FIG. 3 is the cross-sectional view of FIG. 2 at a later time in the method.

As shown in FIGS. 2–5, the starting structure starts off with the traces 13 firmly attached to layer 12. First surface 14 of support layer 12 is subjected to an etchant which etches away the first surface 14 around the traces 13. A mask of material resistant to the etchant may be utilized to protect the other surfaces of the support layer from the etchant. As the etchant progressively removes material from the support layer 12, the etchant erodes the first surface 14 of the support layer so that the first surface recedes. The etchant then progressively removes material from the support layer 12 underneath the traces 13. As shown in FIG. 3, the newly created first surface 14 has receded from the trace 13 so that the trace is vertically spaced from the support layer 12. However, the etching is halted before all of the dielectric material underneath buttons 16 has been removed, leaving anchors 25. The anchors cover a sufficient area of the traces 13 to firmly connect traces 13 to the support layer 12. Thus, the traces 13 have anchored portions 26 and unanchored portions 27.

Figure 5:
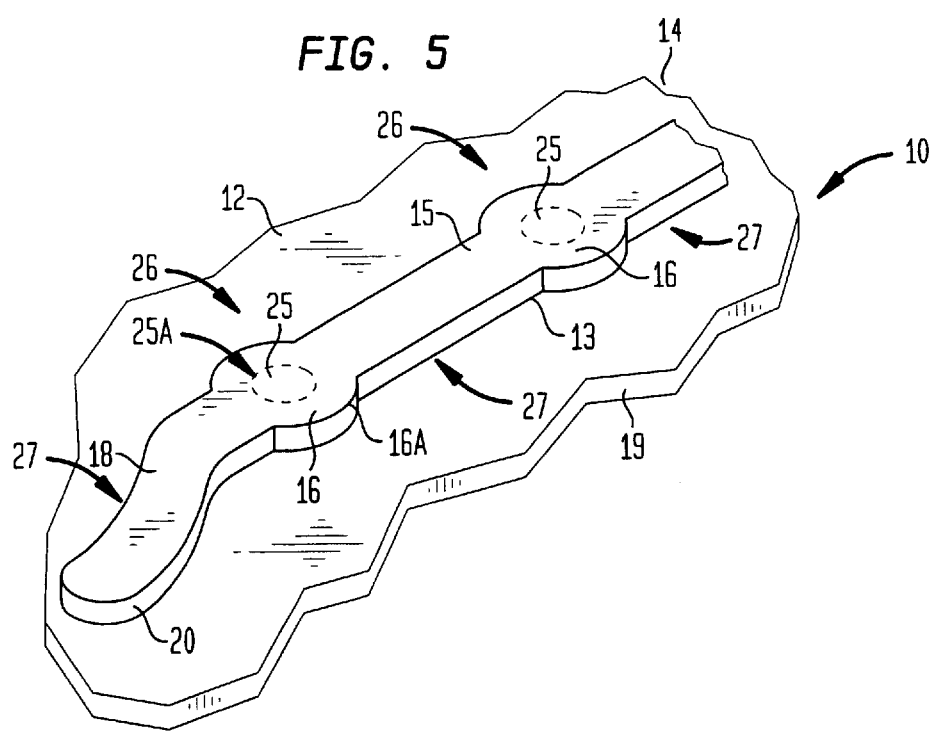
FIG. 5 is a top right perspective view of FIG. 3.

The anchors 25 have an area of contact 25A with the trace 13. The area of contact 25A is less than the surface area 16A of the trace 13 at the buttons 16, as seen in FIG. 5.

Figure 4:
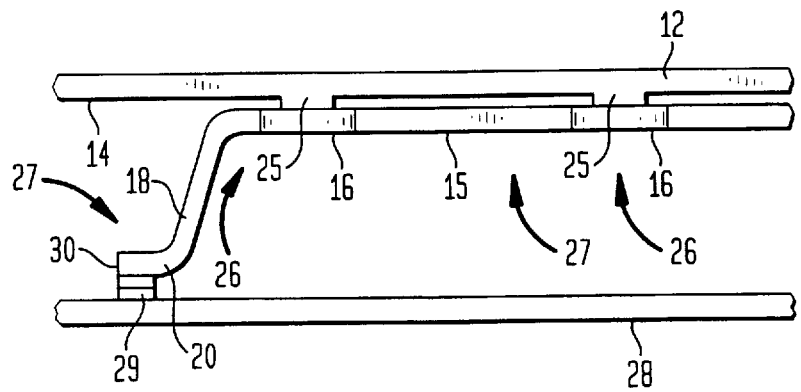
FIG. 4 is the cross-sectional view of FIGS. 2–3 at a later time in the method.

After forming anchored and unanchored portions for the traces 13 in the component 10, the traces 13 may be bonded to contacts 29 on a microchip or other microelectronic device 28 as shown in FIG. 4. In one method of connecting the component, an end 20 of narrow lead section 18 is bonded to contact 29 and support layer 12 and microelectronic element 28 are moved in relation to each other to deform narrow lead section 18 and provide a space between the support layer 12 and microelectronic element 28. An encapsulant, which may be a rigid encapsulant but preferably comprises a compliant material, can be used to encapsulate the assembly. Injection of an encapsulant may also be utilized so that the microelectronic element 28 and the support layer 12 may are moved apart from each other to create space for the encapsulant. The assembly of microelectronic element 28 and the support layer 12 may e accomplished as disclosed in certain embodiments of U.S. Pat. No. 5,518,964, the disclosure of which is hereby incorporated by reference herein.

A preferred method of etching support layer 12 is to expose the support layer to a gaseous etchant which desirably is a plasma of oxidizing reactant gas mixture incorporating one or more oxidizing moieties such as a halogen, oxygen, or mixtures thereof, as disclosed in U.S. patent application Ser. No. 09/020,750, filed Feb. 9, 1998, the disclosure of which is hereby incorporated by reference herein.

The resulting connection component has a support structure 19 including a support layer 12, and a number of metallic conductive structures 13 overlying a surface of the support layer 12. The conductive structures 13 are vertically spaced from the first surface 14 of the support layer 12 by a plurality of anchors 25 extending between the conductive structures 13 and the support layer 12. The anchors 25 extend from a wider section 16 of conductive structures 13 to the first surface 14 of the support layer 12. Elongated sections 15 extend between the wider sections 16. The anchors 25 are spaced along the length of the conductive structures 13 so that elongated sections 15 are unsupported and extend above the first surface 14 of the support layer 12.

Figure 6:
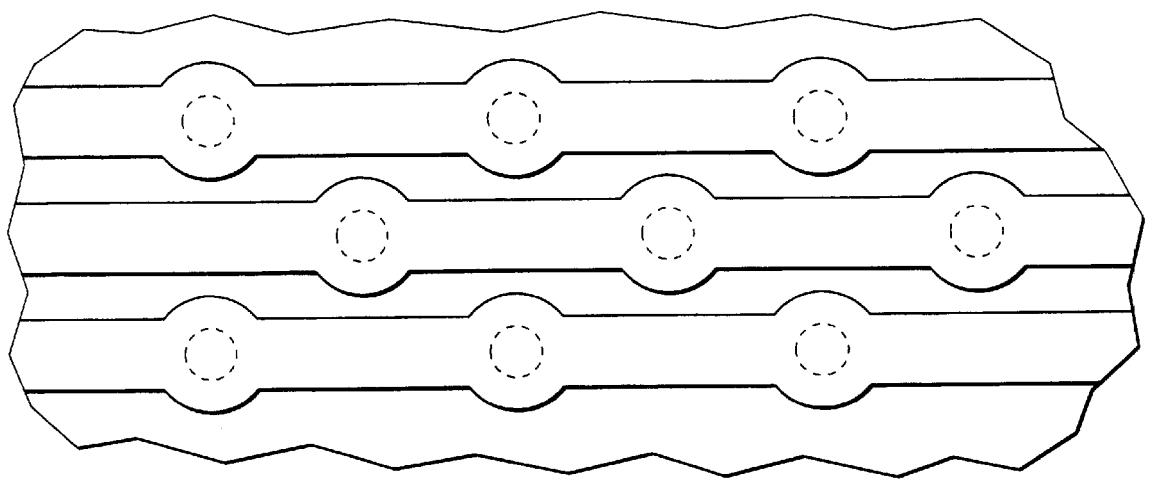
FIG. 6 is a partial plan view of a connection component made in accordance with the embodiment of FIGS. 1–5.

Traces formed in accordance with the foregoing embodiment of the invention may be closely spaced on a connection component, as illustrated in FIG. 6. The narrower elongated sections 15 enable the traces 13 to be closely spaced adjacent one another on the support layer 12 and the wider sections 16 are staggered and positioned adjacent the elongated sections 15 for this purpose.

In a method in accordance with another embodiment of the invention, shown in FIGS. 7 and 8, a starting structure 111 has a support layer 112 formed from a dielectric material such as polyimide, and metallic conductive structures comprising a number of traces 113 extending on a surface of the support layer 112, as discussed above in connection with FIG. 1. In this embodiment, traces 113 are comprised of a base layer 129 of metal in contact with the support layer 112 and a cover layer 130 of a different metal, having different etching properties from the metal of the base layer, overlying the base layer 129. For example, the base layer may be comprised of copper or a copper-rich alloy and the cover layer 130 may be comprised of an etch-resistant metal such as gold. Acid etching solutions such as HCl and CuCl may be used. During the etching process, a liquid etch solution attacks the base layer 129, undercutting the trace, and progressively separating the trace 113 from the support layer 112. The etchant, however, leaves the support layer substantially unaffected. The base layer may be etched as discussed in connection with certain embodiments of U.S. Pat. No. 5,518,964, the disclosure of which is hereby incorporated by reference herein. After the step of removing metal, the traces 113 are vertically spaced from the support structure 112, as shown in FIG. 8. An end 120 of the trace 113 in the resulting component 110 may comprise a lead section 118 for connection to a microchip or another microelectronic element, such as a wafer as discussed above in connection with FIG. 4.

Thus, material may be removed from the metallic conductive structures or the support layer or both to separate the conductive structures from the support layer while creating anchors which firmly attach the conductive structures to the support layer. The removing of material may be performed by etching where the support layer and metal or metals of the conductive elements have different etching characteristics. Alternatively or additionally, etch-resistant masks may be utilized to protect the support layer, the conductive structures, or portions thereof, from the etchant utilized. After etching, the mask may be rinsed away from the component. The support layer may comprise a layer of any polymeric dielectric or metallic material having the desired characteristics, as discussed above. The conductive structures may be comprised of any electrically conductive material having the desired characteristics as discussed above. The support layer may also include a layer of metal having different characteristics from the conductive structures, as shown in FIG. 9. For example, the support layer 219 may be comprised of top layer 212A of aluminum or an aluminum alloy overlying a bottom layer of 212B of dielectric material. The aluminum or aluminum alloy is etchable in a caustic etch solution. The aluminum layer is etched, leaving anchors like those shown in FIG. 3 and traces 213, which may be comprised of copper. The support layer 212 may include a metal unaffected by an etching solution which attacks the metal of the traces or other conductive structures 213.

Figure 10:
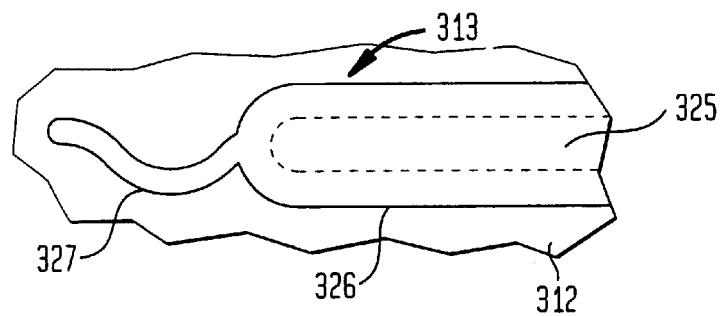
FIG. 10 is a partial top plan view of a connection component made in a method in accordance with another embodiment of the invention.

Methods in accordance with the present invention may form anchors in various configurations. In a method according to a further embodiment of the invention, an elongated anchored portion 326 as shown in FIG. 10 is formed. The starting structure in this embodiment comprises a support layer having a number of traces 313 extending on a surface thereof. The traces have a wider section for forming an anchor 325 securely attaching the traces 313 to the polyimide support layer 312. The traces 313 also include a narrower section for forming unanchored portions 327. The anchored portions 326 and unanchored portions 327 are formed in an etching process which removes material from the traces or the support layer 312 or both, as discussed above.

The microelectronic connection component formed includes elongated anchors 325 attaching traces 313 to a support layer 312 as shown in FIG. 10. The traces 313 also include unanchored section 327 for bonding to a microchip or other microelectronic element, such as a wafer, as discussed above.

Figure 11:
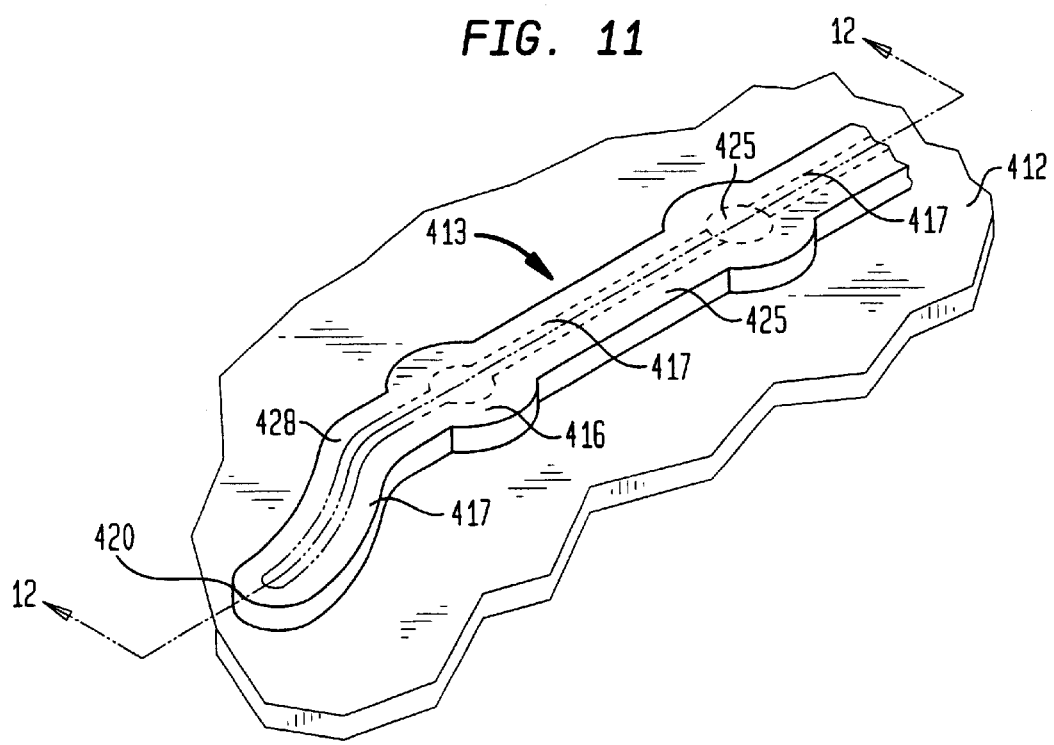
FIG. 11 is a partial top right perspective view of a connection component made in accordance with a further embodiment of the invention.
Figure 12:
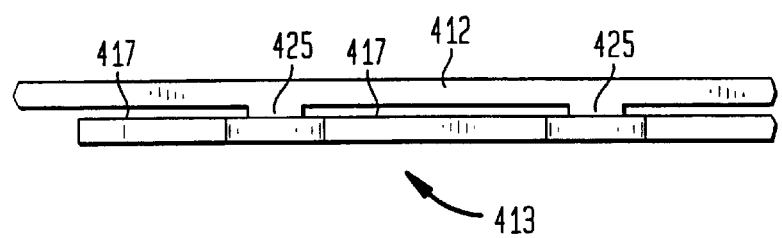
FIG. 12 is a cross-sectional view taken along line 12—12 in FIG. 11.

In a method according to another embodiment of the invention, the etching process is halted before portions of the traces are entirely detached from the support layer. As shown in FIGS. 11 and 12, the support layer 412 is subjected to an etching process which removes material from the support layer beneath the traces 413. The etching process is continued until only narrow, web-like elements 417 remain beneath elongated sections 415 of the traces 413. The material beneath wider sections 416 remain as anchors 425 firmly connecting traces 413 to the support layer 412. Thus, a releasable lead portion 428 of the traces 413 may be formed. Web-like elements 417 are narrow enough to releasably attach lead portions 428 to the support layer 412 so that an end 420 of lead portion 428 may be bonded to a microchip or other microelectronic element, such as a wafer, and deformed in the manner discussed above. During the deformation of the lead portion 428, the web-like element 417 is broken so that lead portion 428 may be displaced with respect to the remainder of the trace 413.

The connection components of FIGS. 11 and FIG. 5 may include a releasable lead portion 428 as shown in FIG. 11 or an unanchored portion 27 as shown in FIG. 5 for bonding to a microchip or other microelectronic element, such as a wafer, as discussed above. The releasable portion and the unanchored portion are preferably curved in a direction transverse to the length of the trace to provide a sufficient length for spanning a space between the connection component and the microchip or other microelectronic element.

A connection component in accordance with another embodiment of the invention is shown in FIGS. 11 and 12. The connection component is similar to the one illustrated in FIG. 5 but includes web-like elements 417 extending from the elongated sections 415 to the support layer 412 and extending between anchors 425. The web-like elements 417 are significantly narrower than the anchors 425. The elongated sections and web-like elements may be formed from the same material as the support layer 412 or from material which previously extended on support layer 412, such as metallic portions of the traces 413, which was removed in a subtractive process as discussed above. Web-like narrow portions of the base metal 129 in FIG. 7 may remain connecting the traces 113 to support layer 112.

Figure 13:
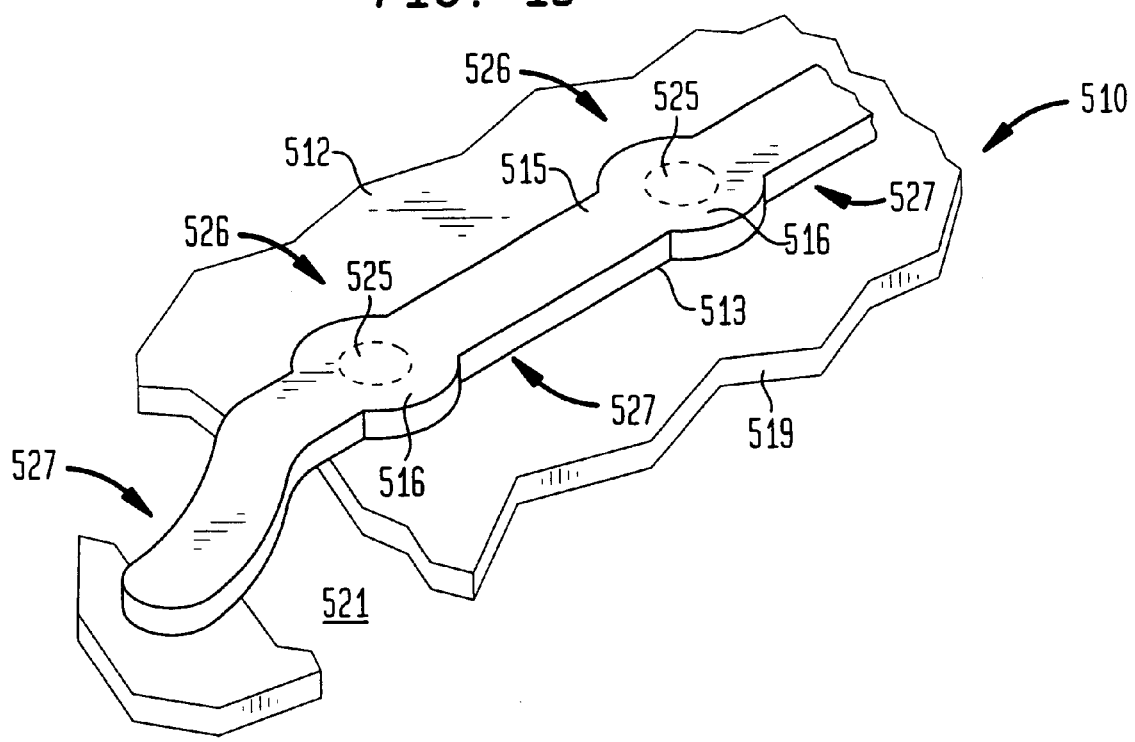
FIG. 13 is a top right perspective view of a connection component in accordance with a further embodiment of the invention.

In another method in accordance with a further embodiment of the invention is shown in FIG. 13. Lead portions 527 of traces 513 may be provided on a starting structure having a gap 521 so that the lead portions 528 extend across the gap 521. A lead portion 528 extends across the gap 521, whereas portions of the traces 513 are firmly attached to the support layer 512 by anchors 525 formed in one of the methods discussed above. The structure may be assembled with a microchip or other microelectronic element and the unanchored or releasable lead portion may be connected to the microchip or other microelectronic element as discussed in connection with certain embodiments of U.S. Pat. Nos. 5,904,498 and 5,763,941 and PCT International Publication No. WO 94/03036, the disclosures of which are hereby incorporated by reference herein.

As these and other variations and combinations of the features discussed above can be utilized without departing from the present invention, the foregoing description of the preferred embodiment be taken by way of illustration rather than by way of limitation of the invention as defined by the claims.

What is claimed is:

1. A microelectronic connection component comprising:
   (a) a support structure including a support layer having a surface;
   (b) one or more metallic conductive structures overlying said surface of said support layer;
   (c) a plurality of anchors spaced from one another and attaching the one or more conductive structures to the support layer at an anchored portion of the one or more conductive structures, said plurality of anchors having an area of contact with the one or more conductive structures, said area of contact being less than the area of the conductive structures at said anchored portion.

2. The component of claim 1, wherein said anchors are integral with said conductive structures.

3. The connection component of claim 1 wherein said anchors are integral with said support layer.

4. The component of claim 1 further comprising releasable connections between said conductive structures and said support layer.

5. The component of claim 1 wherein said conductive structures include portions unattached to said support layer.

6. The component of claim 1 wherein said conductive structures include elongated portions and said anchored portions have a width larger than said elongated portions.

7. The component of claim 1 wherein said conductive structures include releasable portions releasably attached to said support layer.

8. The component of claim 1 wherein said conductive structures include elongated releasable portions extending across a gap in said support layer.

9. The component of claim 8 wherein said elongated releasable portions are curved.

10. The component of claim 1 wherein said conductive structures include portions vertically spaced from said support layer.

11. The component of claim 1 wherein said conductive structures include sections of different widths, including a plurality of wider sections having a first width and a plurality of narrower sections having a second width less than said first width, said anchors attaching the conductive structures to said support layer at said wider sections.

12. The component of claim 11 wherein said conductive structures are spaced on said component so that said wider portions of a first conductive structure are adjacent narrower portions of a second conductive structure.

* * * * *